US008022802B2

(12) United States Patent  
Schaerrer et al.

(10) Patent No.: US 8,022,802 B2  
(45) Date of Patent: Sep. 20, 2011

(54) SENSOR FOR HIGH VOLTAGE ENVIRONMENT

(75) Inventors: Marc Schaerrer, Bernex (CH); Wolfram Teppan, Collonges-sous-Saleve (FR)

(73) Assignee: Liaisons Electroniques-Mecaniques LEM SA, Plan-les-Ouates (CH)

( * ) Notice: Subject to any disclaimer, the term of this patent is extended or adjusted under 35 U.S.C. 154(b) by 118 days.

(21) Appl. No.: 12/456,674

(22) Filed: Jun. 19, 2009

(65) Prior Publication Data

US 2010/0007358 A1  Jan. 14, 2010

(30) Foreign Application Priority Data

Jul. 11, 2008  (EP) .................................. 08160300

(51) Int. Cl.
```
H01F 5/00      (2006.01)
H01F 27/28     (2006.01)
H01F 17/04     (2006.01)
H02M 3/00      (2006.01)
H02M 3/335     (2006.01)
H02M 5/16      (2006.01)
```
(52) U.S. Cl. ........ 336/200; 336/220; 336/221; 336/222; 336/223; 336/232; 363/15; 363/20; 363/34; 363/171

(58) Field of Classification Search .................. 336/200, 336/220–223, 232; 363/15, 20, 34, 171  
See application file for complete search history.

(56) References Cited

U.S. PATENT DOCUMENTS

| | | | | |
|---|---|---|---|---|
| 3,153,199 A * | 10/1964 | Blokker | | 327/304 |
| 4,172,244 A | 10/1979 | Zeis | | |
| 5,631,822 A * | 5/1997 | Silberkleit et al. | | 363/144 |
| 7,187,263 B2 * | 3/2007 | Vinciarelli | | 336/200 |
| 2006/0056205 A1 * | 3/2006 | Kyono | | 363/15 |
| 2008/0303512 A1 * | 12/2008 | Gudel et al. | | 324/127 |

FOREIGN PATENT DOCUMENTS

| | | |
|---|---|---|
| EP | 1659413 A1 | 11/2004 |
| GB | 2285892 A | 7/1995 |
| GB | 2307795 A | 6/1997 |
| WO | WO 96/17360 | 6/1996 |

OTHER PUBLICATIONS

Brehaut Stephane et al., Gate driving of high power IGBT through a Double Galvanic Insulation Transformer, IEEE Apr. 2006, pp. 2505-2510.

* cited by examiner

Primary Examiner — Anh T. Mai  
Assistant Examiner — Ronald W Hinson  
(74) Attorney, Agent, or Firm — Baker & Daniels LLP

(57) ABSTRACT

Sensor for measuring electrical parameters in a high voltage environment comprising a high voltage side (4) for connection to high voltage conductors, a low voltage side (6) for connection to low voltage power supply and measurement signal control circuitry, a measurement signal circuit (16), and a power supply circuit (14), and at least one isolating transformer (18, 20) for transmission of electrical power supply and/or measurement signals between the low voltage side and the high voltage side. The isolating transformer comprises at least a first and a second transformer core (28), a transformer coil (33) on a circuit board around a branch (27) of the transformer core on the high voltage side and a transformer coil (32) on a circuit board around a branch (29) of the transformer core on the low voltage side, the isolating transformer further comprising an intermediate coil (36) encircling at least one branch of each said at least two transformer cores.

16 Claims, 7 Drawing Sheets

SENSOR FOR HIGH VOLTAGE ENVIRONMENT

FIELD OF THE INVENTION

The present invention relates to a sensor for measuring electrical parameters in a high voltage environment.

BACKGROUND OF THE INVENTION

There are many applications requiring highly isolated yet accurate and rapid measurement of electrical parameters such as voltage, current, frequency and power in a high voltage environment for control and drive purposes or simply for monitoring purposes. An example is electrical drives for railway locomotives that are supplied with electrical current at a voltage of around 3000V. In many of these applications, the measurement signal needs to be transmitted to electronic circuitry in a low voltage environment for control and/or display purposes. It is also desired in certain applications to power the sensor from a power supply situated in the low voltage environment. The transmission of power and signals from a high voltage environment to a low voltage environment requires isolation between the high and low voltage circuit commensurate with the maximum possible voltage difference and applicable standards in order to avoid electrical creep and breakdown.

A sensor for high voltage applications is described in European patent application 1 659 413 in which the measurement signal is transmitted from the high voltage to the low voltage side via an optical fibre transmission, whereas the power supply is transmitted through an isolating transformer system. The isolating transformer comprises three transformer cores interconnected by conductor windings formed by U-shaped terminals mounted on circuit boards having conductive circuit traces interconnecting the ends of the U-shaped terminals in order to close the winding loops. While the sensor according to this prior art has good isolation properties, there is a desire to simplify the construction of the sensor in order to reduce manufacturing cost, increase consistency of isolation properties, reduce defects and the number of faulty parts, and increase reliability of the sensor. It is further a desire to ensure high performance and low measurement error shift over the life time of the sensor.

SUMMARY OF THE INVENTION

It is an object of this invention to provide a sensor for measuring electrical parameters in a high voltage environment, having a low voltage power supply and measurement signal processing circuit, that is economic to produce yet accurate safe and reliable, in particular as concerns the avoidance of electrical creep and breakdown.

It would be advantageous to provide a high voltage sensor that is robust, comprises few parts, and is easy to assemble.

It would be advantageous to provide a high voltage sensor that can be easily configured and manufactured for different operating ranges.

Objects of this invention have been achieved by providing the sensor for measuring electrical parameters in a high voltage environment according to claim 1.

Disclosed herein is a sensor for measuring electrical parameters in a high voltage environment comprising a high voltage side for connection to high voltage conductors, a low voltage side for connection to low voltage power supply and measurement signal control circuitry, a measurement signal circuit, and a power supply circuit, and at least one isolating transformer for transmission of electrical power supply and/or measurement signals from the low voltage side to the high voltage side or from the high voltage side to the low voltage side. The isolating transformer comprises at least a first and a second transformer core, a transformer coil on a circuit board around a branch of the transformer core on the high voltage side and a transformer coil on a circuit board around a branch of the transformer core on the low voltage side. The isolating transformer further comprises an intermediate coil encircling at least one branch of each said at least two transformer cores. The intermediate coil may advantageously be formed as a conductive track or tracks in a circuit board.

The circuit boards are provided with holes or cut outs to allow passage of the transformer core branches therethrough.

The measurement signal circuit and power supply circuits preferably each comprise an isolating transformer. The transformer cores of the measurement signal circuit isolating transformer may advantageously be identical to the transformer cores of the power supply circuit isolating transformer in order to reduce the number of different parts to be manufactured. The transformer coils may be easily adapted to the signal strength and frequency by varying the shape, length, cross-section and number of turns of the coils formed on the circuit boards. The coils formed in the circuit boards may advantageously be formed by circuit traces on multiple layers of the circuit board. The provision of coils in the circuit boards also significantly reduces the capacitive coupling between the coils and transformer core in comparison to wire wound cores. This in turn reduces the stray capacitance between primary and secondary circuits.

Preferably the transformer coils are formed on a common first circuit board and the intermediate coil or coils are formed on a second circuit board separate from the first circuit board. The first circuit board may however be split into two separate parts,—one for the high voltage side circuit and one for the low voltage side circuit. The second circuit board carrying the intermediate coil may also be spilt into two separate parts—one for the measurement signal circuit and one for the power supply circuit. It may also be integrated in the common circuit board mentioned above at the cost of reduced isolation.

The provision of transformer coils in the first and second circuit boards provides great versatility in the design of the coils for optimal performance for the desired required power, switching frequency and transforming ratio. The coils on the circuit board also reduce manufacturing and assembly costs while allowing accurate position of the coils with respect to the transformer cores and providing consistently a high degree of isolation between the high and low voltage circuit parts. Within the scope of this invention, it is also possible to provide the intermediate coil as a conductor loop that is not in a circuit board, for example as a stamped and formed conductor or as a wire loop conductor. The intermediate may have one or more turns connected in series or in parallel.

The transformer core may advantageously be in the form of a essentially rectangular rigid ferrite material part. The transformer core may also be made of other magnetic materials (i.e. materials with a high magnetic permeability). The at least two transformer cores are preferably identical. The transformer core may be formed of a first U-shaped part and a second essentially straight bar-shaped part that closes the magnetic circuit of the transformer core.

Means for fixing the transformer cores may advantageously be electrically conductive and connected to corresponding reference voltages. The reference voltages may, for example, be the ground of the primary side for the cores that are close to the high voltage side and the ground of the secondary side for the two cores that are close to the low voltage side. Fixing the potential of the cores as described above will reduce the voltage difference between the coils of the high and low voltage sides with respect to the transformer cores and concentrate the voltage difference between the cores and the intermediate coil, where it is easier to deal with.

Further objects and advantageous aspects of the invention will be apparent from the claims, the following detailed description and annexed drawings.

DETAILED DESCRIPTION OF EMBODIMENTS OF THE INVENTION

Figure 1:
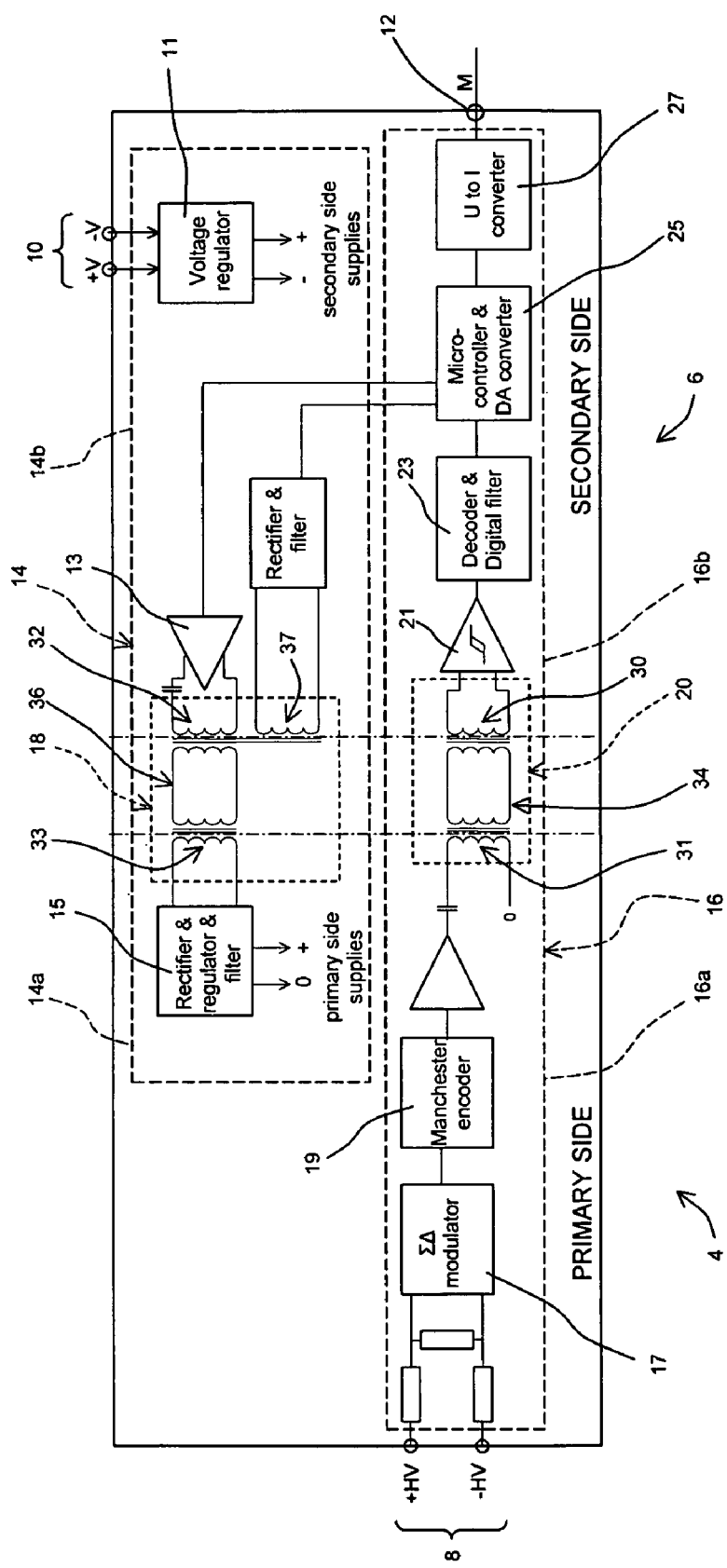
FIG. 1 is block diagram of a high voltage sensor according to the invention.
Figure 2:
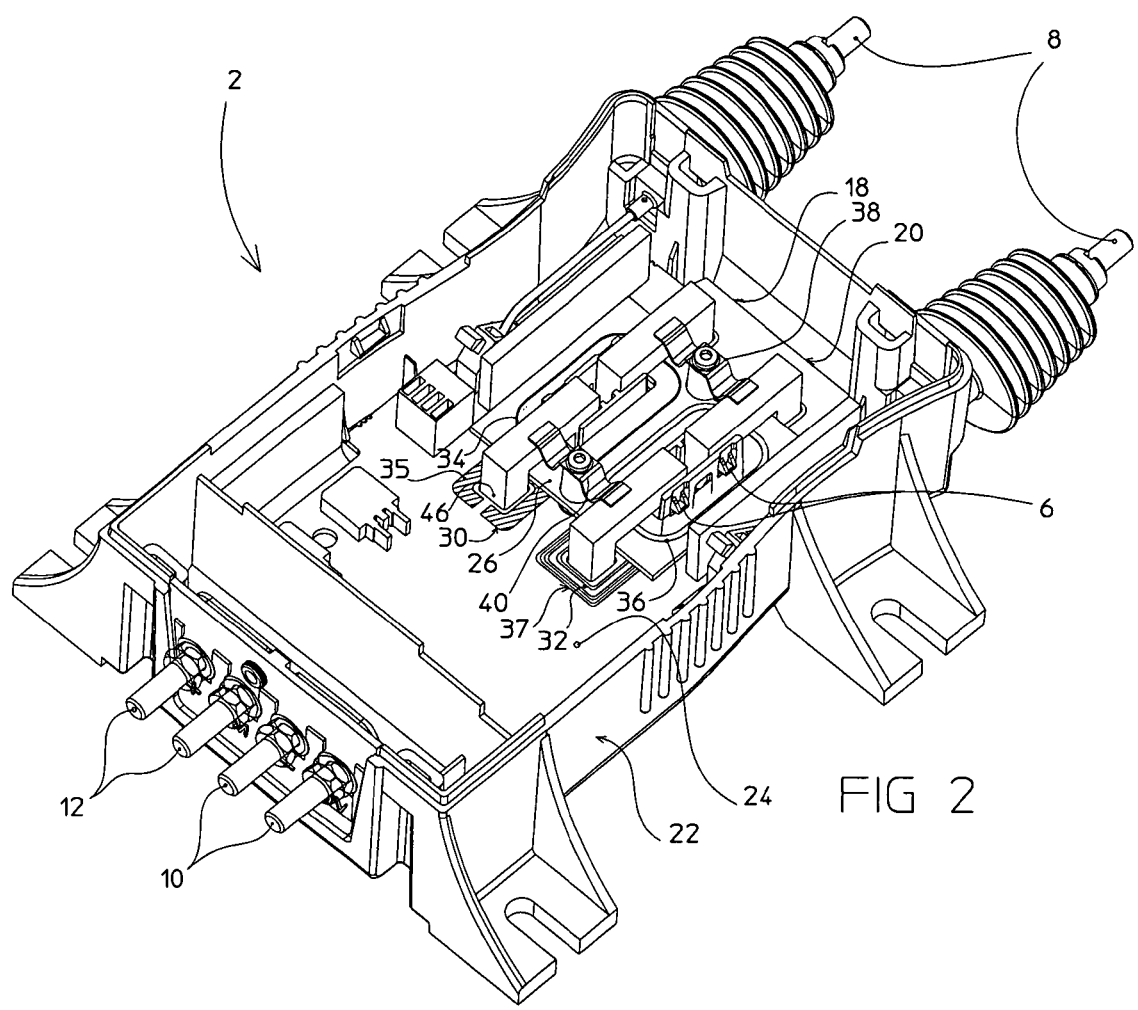
FIG. 2 is a perspective view of a high voltage sensor according to an embodiment of this invention, with the cover removed and without resin filling.

Referring to the figures, in particular FIGS. 1 and 2, a high voltage sensor 2 comprises a high voltage side 4 (also named herein primary side) for connection to conductors at a high voltage to be measured (primary voltage), and a low voltage side 6 (also named herein secondary side) connected to conductors or circuits at a low voltage for power supply and for the measurement signal. The primary side is provided with connection terminals 8 for connection to the primary conductors, and the secondary side 6 is provided with terminals 10 for connection to a power supply line, and terminal 12 for connection to measurement signal line for transmission of the measurement signal to a control and/or display unit.

The sensor includes an isolated power supply circuit 14 comprising a secondary side 14b with a driver 13 and voltage regulator 11 connected to the supply terminal inputs 10, a primary side 14a with a rectifier, regulator and filter and an output for supplying power to electronic circuitry on the high voltage side, and an isolating transformer 18 between the primary and secondary sides 14a, 14b for the transfer of power from the low voltage to the high voltage side. The low voltage side of the transformer 18 includes an auxiliary regulation winding 37 that is used by the micro-controller to control and adjust the primary supply voltage by changing the switching frequency.

The sensor further comprises a measurement signal circuit 16 comprising a primary side 16a with a measurement signal processing circuit including an analogue to digital converter, a secondary side 16b with a signal processing circuit comprising a digital to analogue converter, and an isolating transformer 20 between the secondary and primary sides of the measurement signal circuit. The conversion of the measurement signal into a digital signal for transmission through the isolating transformer 20 to the low voltage side ensures reliable transmission of the signal with a low sensitivity to external field disturbances and noise as well as internal distortion effects and noise that may arise during the transmission of a signal through the isolating transformer.

In the embodiment illustrated, the analogue to digital converter comprises a sigma-delta modulator 17 to modulate the measurement signal, and a Manchester encoder 19. The use of sigma-delta modulation and Manchester encoding is particularly well suited for signal transmission over the isolating transformer, produces low latency, allows easy synchronization for the decoder and is very robust to perturbations. It may however be noted that within the scope of the invention it would be possible to use other modulation and encoding methods known in the art. On the secondary side, the measurement signal processing circuit 16b comprises a differential receiver 21 to reshape the transmitted signal which is fed into a decoder and digital filter 23 and then a micro-controller and digital to analogue (DA) converter 25.

The micro-controller 25 also generates the modulation signal for the isolating transformer 18 of the power supply circuit, on the secondary side 14b via a driver 13. The micro-controller is used not only for processing the measurement signal but also for controlling the power supply circuit 14. The frequency applied to the transformer is varied according to the voltage measured on the auxiliary regulation winding 37 and the temperature to adjust the rectified voltage on the primary side. The voltage regulator 11 of the power supply circuit also supplies power to the micro-controller and other circuit components of the measurement signal circuit on the secondary side.

In the embodiment shown, the measurement signal at the output of the micro-controller and DA converter is then transformed through a voltage-current converter 27 and supplied at the connection terminals 12. There may be other types of outputs such as voltage output, pulse-width modulation (PWM) output, digital output, or other known measurement signal outputs.

It should be noted that the circuit design of the illustrated embodiment is an example of a preferred embodiment, however the processing of the measurement signal on the secondary side may be performed in many different ways known in the art, depending also on the desired type of output of the measurement signal.

The sensor can be easily adapted for reasonably different operating ranges in an optimal manner by modifying the gain programmed in the micro-controller without requiring changes in the design of the transformer cores and assembly of the circuit boards and transformer core parts in the housing.

Figure 3:
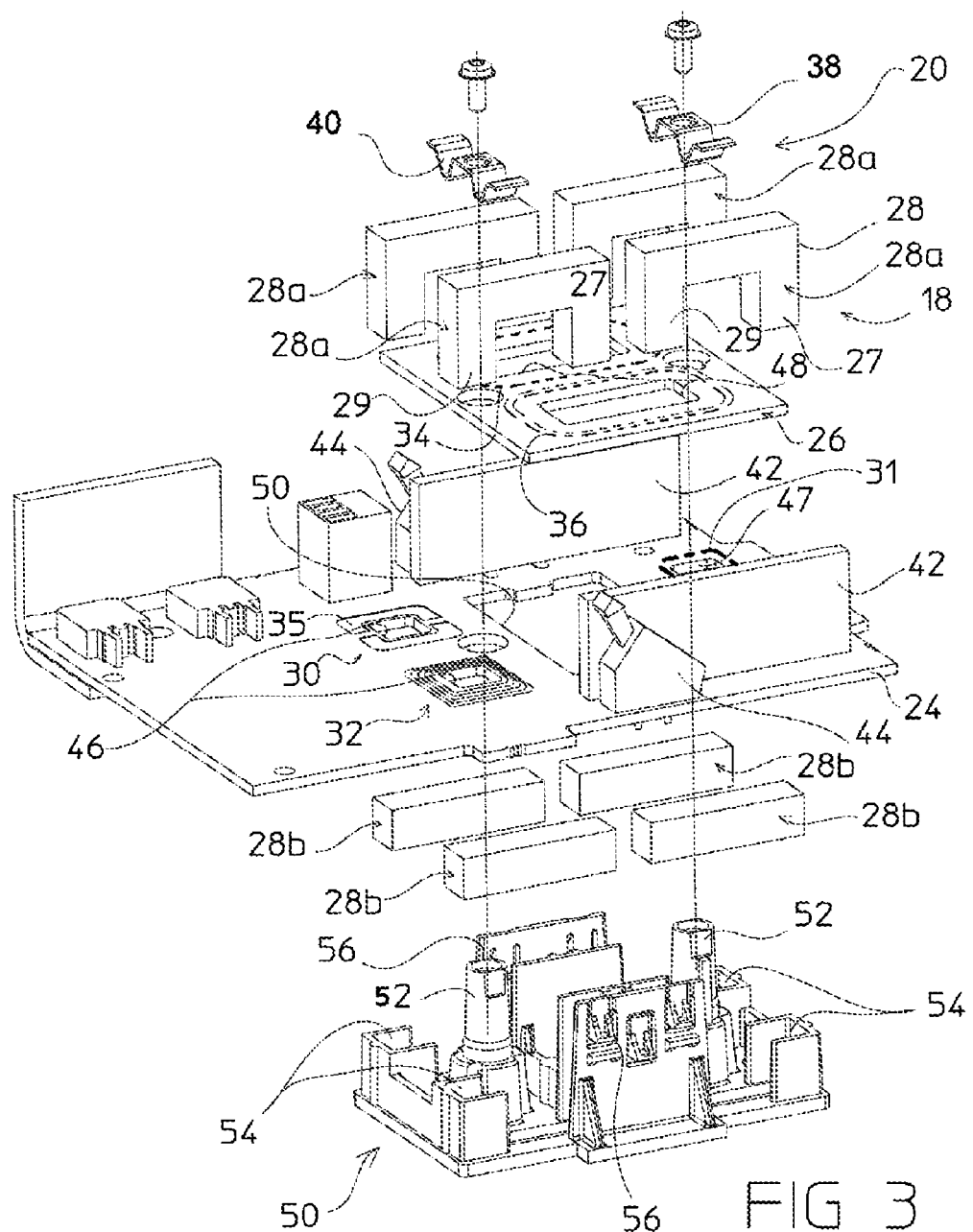
FIG. 3 is an exploded isometric view of the high voltage sensor according to FIG. 2, without the housing.

Referring in particular to FIGS. 2 and 3, the sensor 2 comprises a housing 22 and a main circuit board (hereinafter named "first" circuit board) 24 on which electronic components for the measurement signal and power supply circuits are mounted. The isolating transformers 18, 20 each comprise a pair of transformer cores 28, respective transformer coils 30, 32 on the secondary side and transformer coils 31, 33 on the primary side, and transformer intermediate coils 34, 36 on a second circuit board 26.

Figure 4:
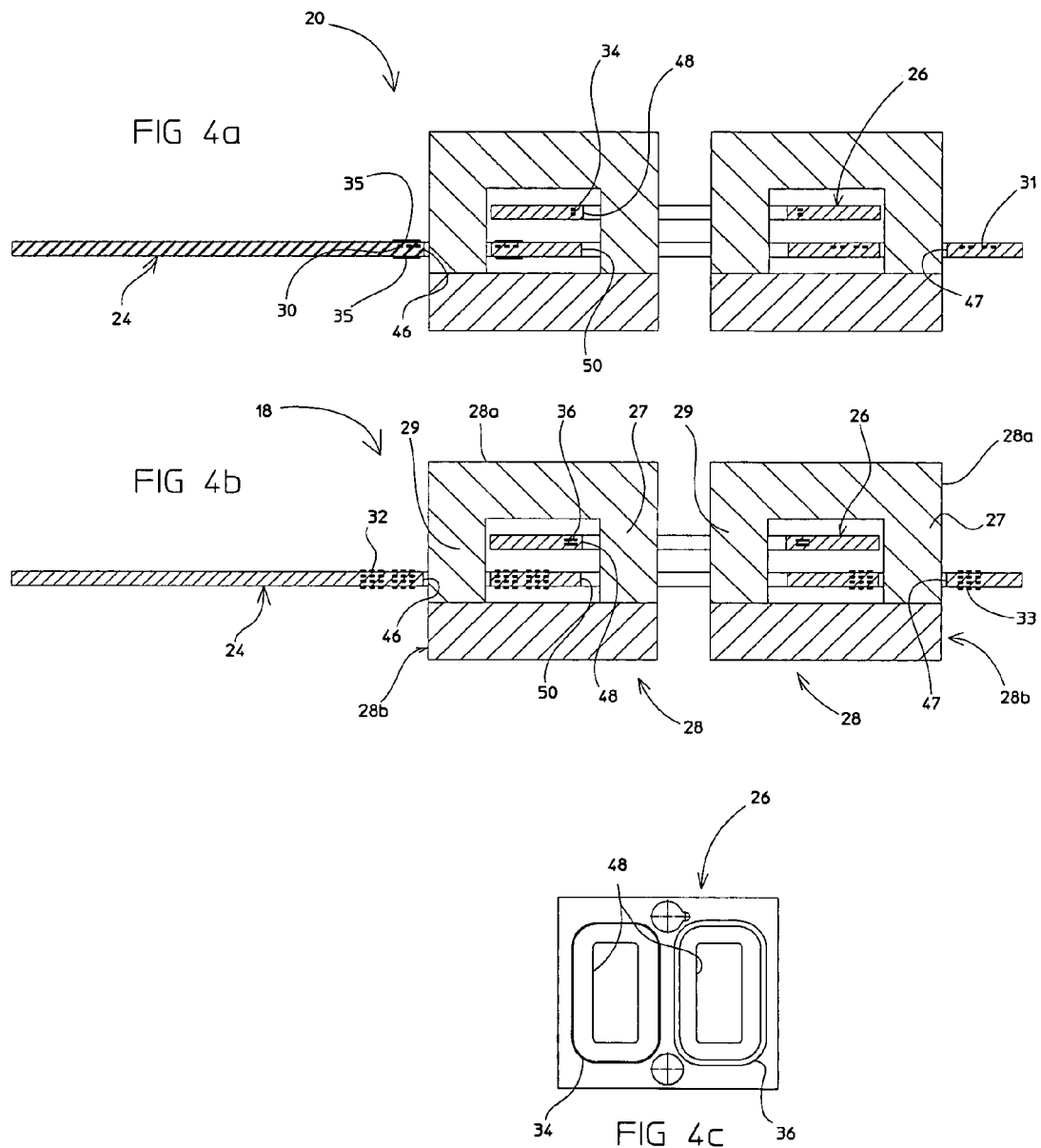
FIG. 4a is a cross-sectional view through an isolating transformer for transmission of a measurement signal of an embodiment of the sensor according to this invention.
FIG. 4b is a cross-sectional view similar to FIG. 4a of an isolating transformer for transmission of power supply.
FIG. 4c is a view of an embodiment of a circuit board including the intermediate coil of the isolating transformer.

The first and second circuit boards are provided with cut outs or holes 46, 47, 48, 50 to allow extension of branches 27, 29 of the transformer cores through the transformer coils 30, 31, 32, 33, 34, 36 formed on the first and second circuit boards. Each of the transformer coils may be freely configured for optimal operation depending on the operating frequency, signal strength and required power. Each coil may thus have a different configuration such as the thickness and width of the conductive circuit traces, the number of turns, and the path and shape of the spirals. As is per se known in circuit board manufacturing techniques, the coils may be provided with conductive traces on multiple layers of the circuit board as best illustrated for example in FIGS. 4a and 4b. A winding with a large number of turns would decrease the maximum operating frequency and a winding with larger effective cross section would increase the current that may be transferred (i.e. the power). The transformer coil 30 of the measurement signal isolating transformer 20 may further be provided with shielding layers 35, as best seen in FIG. 4a, on opposed outer surfaces of the first circuit board 24, to reduce perturbations of the signal by capacitively coupled signals.

It may be noted that the main circuit board may be split into two or more circuit boards without departing from the scope of this invention. It may also be noted that the "second" circuit board may be split into two or more circuit boards without departing from the scope of this invention. Therefore, within the scope of this invention, the transformer cores of the power supply isolating transformer 18 may be mounted/coupled to a first circuit board and a second circuit board that is separate from a first circuit board and a second circuit board to which the transformer cores of the measurement signal isolating transformer 20 are mounted/coupled.

The arrangement of the transformer coils in the circuit boards also eliminates the need for electrically interconnecting the transformer coils to the electronic components of the circuit board during assembly. This arrangement also advantageously enables accurate positioning and spacing between the transformer coils and the transformer cores, as well as reducing capacitive coupling therebetween (as compared to a wire wound transformer).

The transformer cores may be connected to earth, or to a reference voltage that is at a value intermediate the voltage of the primary conductor and the voltage of the secondary side so as to reduce the risk of electrical creep and/or breakdown between the transformer cores and transformer coils. It is possible to have two different voltages, at different levels, one for the transformer cores 18, 20 on the high voltage side and one for the transformer cores 18, 20 on the low voltage side. The reference voltages may be connected to the transformer cores by various means, whereby in the embodiment illustrated the references voltages are connected to the transformer cores by means of conductive clamps 38, 40 that also serve to mechanically fix the transformer cores in their assembled position.

Figure 6:
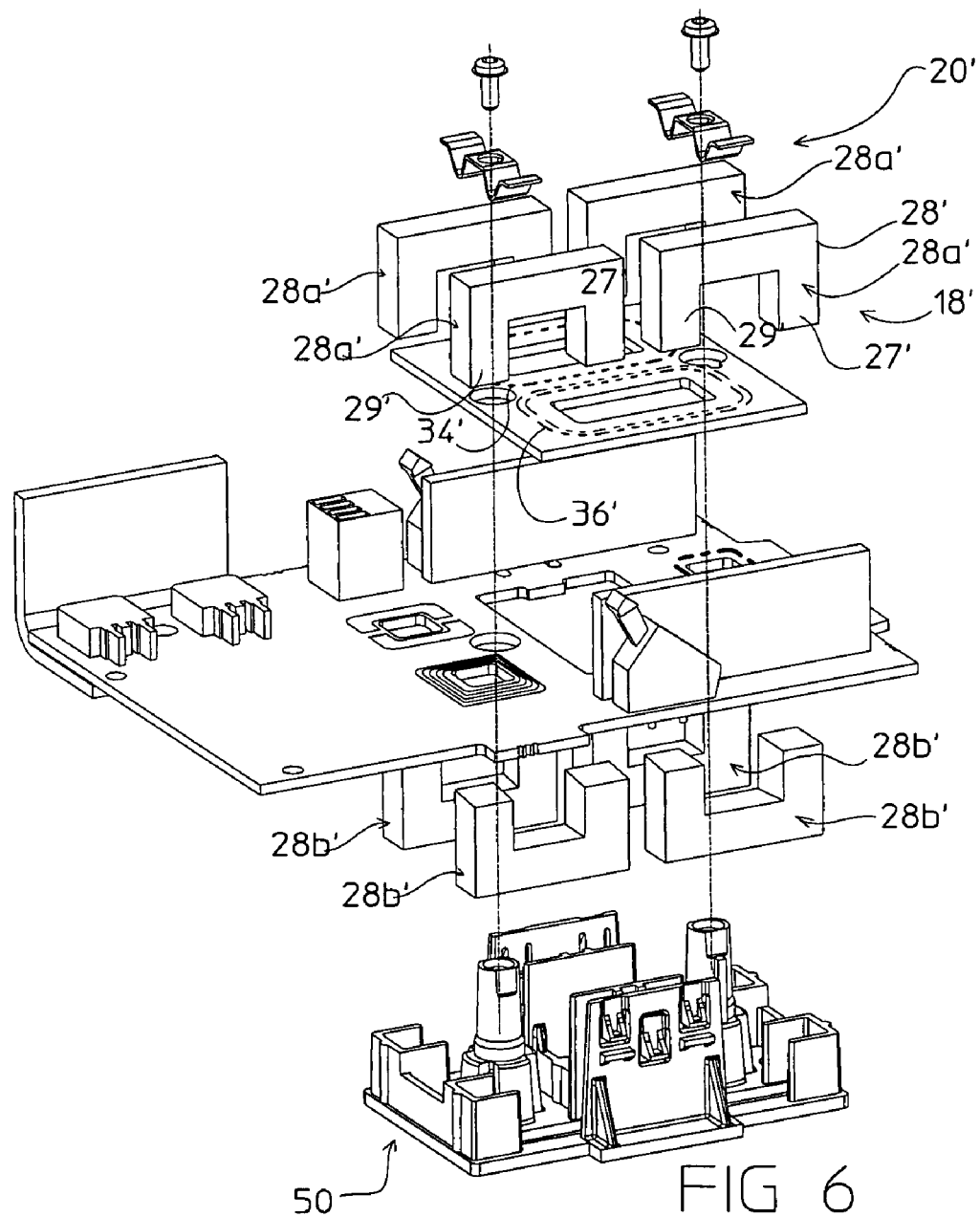
FIG. 6 is an exploded isometric view of isolating transformers according to yet another embodiment.
Figure 7:
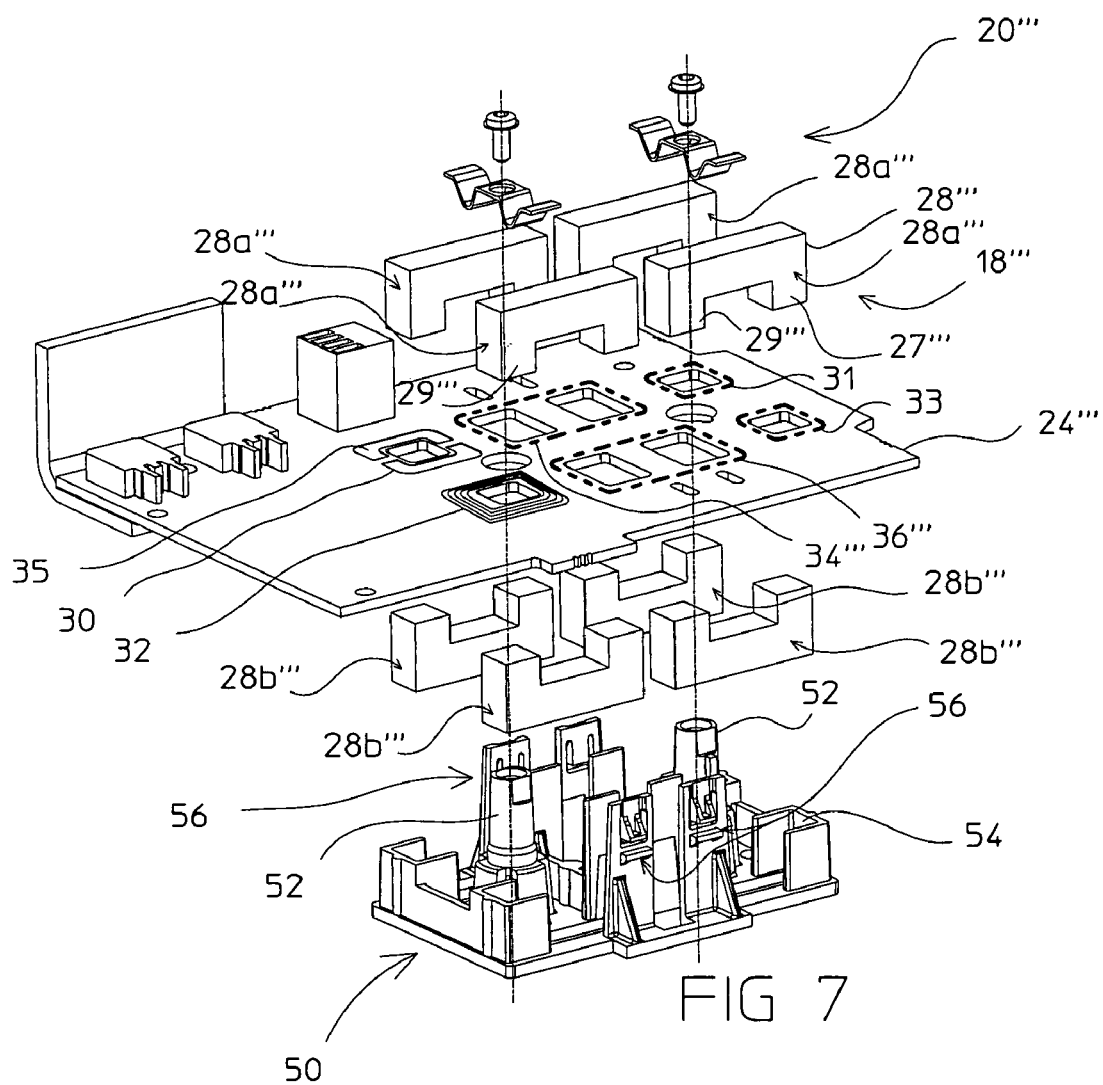
FIG. 7 is an exploded isometric view of isolating transformers according to yet another embodiment.

Each transformer core is preferably made of two parts 28a, 28b, 28a', 28b', 28a", 28b", 28a''', 28b''' to allow assembly either side of the circuit boards 24, 26, 24', 26', 24", 26", 24'''. In the embodiment shown in FIG. 3, each transformer core has a rectangular shape, with one part 28a having a U-shape and the other part 28b in a form of a straight bar that closes, i.e. that interconnects the free ends of the branches 27, 29 of the U-shaped parts 28a. It would however be possible to provide the transformer core in other shapes and configurations, for example as shown in FIGS. 6 and 7 in the form of two U-shaped parts 28a', 28b', 28a''', 28b''' that are joined together at an interface defined by the free ends of the arms 27', 29', 27''', 29''' of the U-shapes such that both parts are identical. The transformer core could also have an oval shape or other shapes. The two part transformer cores and circuit boards of the sensor may be assembled into a separate portion of the housing essentially from the same direction thus facilitating assembly.

Figure 5:
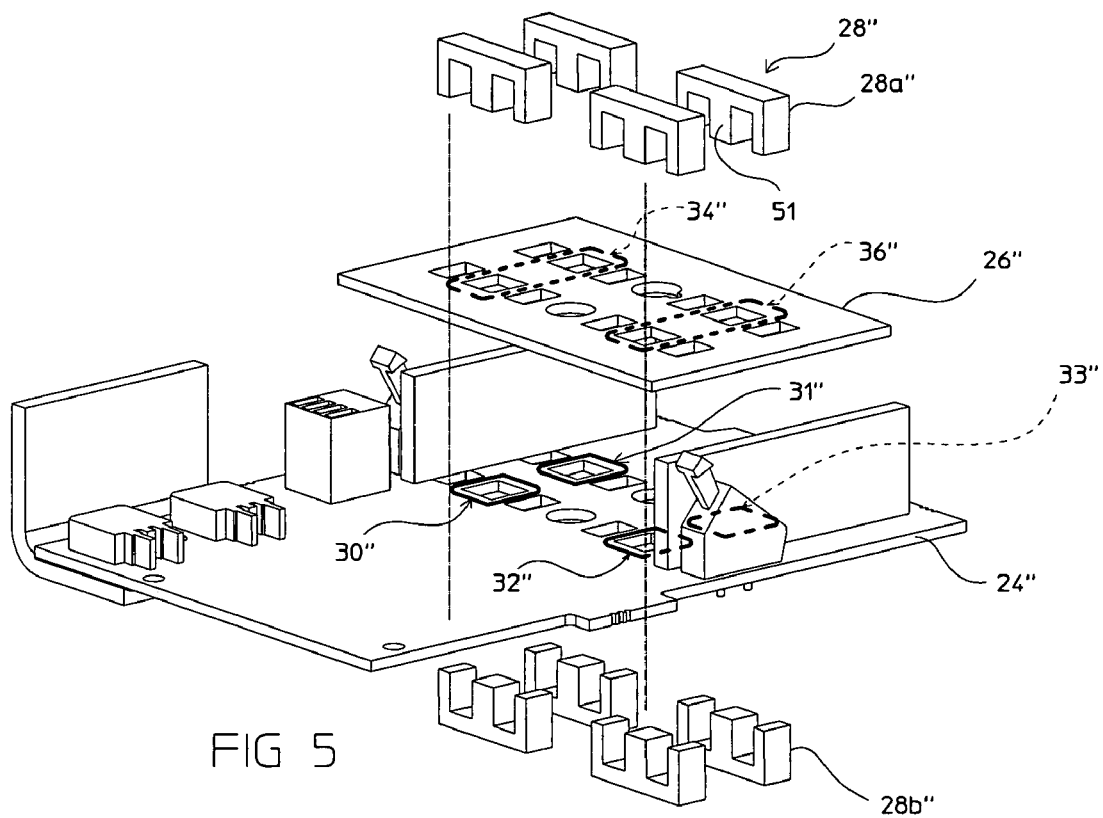
FIG. 5 is an exploded isometric view of isolating transformers according to another embodiment.

As be seen at FIG. 5, the transformer cores 28" may be provided with a central branch 51 (EE or E-I cores combinations) without changing the working principle as discussed in relation to the embodiment of FIG. 3. Compared to the variant of FIG. 3, "E" shaped transformer core parts 28a''', 28b''' better shield the transformer coils 30", 32", 31", 33" and intermediate coils 34", 36" against magnetic and electric fields (immunity and susceptibility). They also provide better magnetic coupling between the coils. However, primary to secondary stray capacitance will increase and isolation distance between primary and secondary will be smaller, reducing the maximum isolation voltage.

As best seen in FIG. 7, in a variant of the invention, the transformer coils 30, 32, 31, 33 and the intermediate coils 34''', 36''' may be provided in the same circuit board—the main circuit board 24'''—instead of separate circuit boards as discussed in relation to the other embodiments illustrated.

In order to position and fix the transformer cores to the circuit board, the sensor may be provided with an insert 50, separate from or integrally formed with the housing 22, comprising cavities 54 for positioning lower transformer core parts 28b, 28b', 28b", 28b''', fixing posts 52 for the clamps 38, 40, and latching means 56 for fixing the insert to the main circuit board 24, 24', 24", 24'''

The invention claimed is:

1. Sensor for measuring electrical parameters in a high voltage environment comprising a high voltage side (4) for connection to high voltage conductors, a low voltage side (6) for connection to low voltage power supply and measurement signal control circuitry, a measurement signal circuit (16), a power supply circuit (14), and at least one isolating transformer (18, 20) for transmission of electrical power supply and/or measurement signals between the low voltage side and the high voltage side, wherein the isolating transformer comprises at least a first transformer core on a high voltage side and a second transformer core on a low voltage side, a first transformer coil on a circuit board around a first branch of the first transformer core and a second transformer coil on a circuit board around a second branch of the second transformer core on the low voltage side, the isolating transformer further comprising an intermediate coil encircling at least a second branch of said first transformer core and a first branch of said second transformer core.

2. The sensor of claim 1 wherein the intermediate coil is formed on a circuit board.

3. The sensor of claim 2 wherein the transformer coils are formed on a first circuit board and the intermediate coil is formed on a second circuit board separate from the first circuit board.

4. The sensor of claim 3 wherein the first and second circuit boards are provided with holes or cut outs to allow passage of branches of the transformer cores therethrough.

5. The sensor of claim 1 wherein each transformer core is made of at least two parts assembled together.

6. The sensor of claim 1 wherein the at least two transformer cores are identical.

7. The sensor of claim 1 wherein the transformer cores are in the form of essentially rectangular ferrite material parts.

8. The sensor of claim 1 wherein each transformer core comprises a U-shaped part and a second essentially straight part that closes the transformer core.

9. The sensor of claim 1 wherein each transformer core is formed of a first U-shaped part and a second U-shaped part.

10. The sensor of claim 1 wherein each transformer core comprises at least one E-shaped part.

11. The sensor of claim 1 wherein one or more transformer cores are electrically connected to reference voltages of either high or low voltage side.

12. The sensor of claim 11 wherein means for fixing the transformer cores are electrically conductive and connected to the reference voltages.

13. The sensor of claim 1 wherein the coils formed in the circuit boards are formed by circuit traces on multiple layers of the circuit board.

14. The sensor of claim 1 wherein the power supply circuit comprises a first said isolating transformer for transmission of electrical power supply from the low voltage side to the high voltage side, and the measurement signal circuit comprises a second said isolating transformer.

15. The sensor of claim 1 wherein the measurement signal circuit comprises a Manchester encoder on the high voltage side.

16. The sensor of claim 1 wherein the power supply circuit comprises a regulation winding on the low voltage side for control and/or adjustment of the power supply circuit voltage.

* * * * *